(12) United States Patent
Au et al.

(10) Patent No.: US 8,634,467 B2
(45) Date of Patent: Jan. 21, 2014

(54) FLEXIBLE WYNER-ZIV VIDEO FRAME CODING

(75) Inventors: Oscar Chi Lim Au, Hong Kong (CN); Xiaopeng Fan, Hong Kong (CN)

(73) Assignee: Choy Sai Foundation L.L.C., Wilmington, DE (US)

( * ) Notice: Subject to any disclaimer, the term of this patent is extended or adjusted under 35 U.S.C. 154(b) by 1455 days.

(21) Appl. No.: 12/115,597

(22) Filed: May 6, 2008

(65) Prior Publication Data

US 2009/0279600 A1 Nov. 12, 2009

(51) Int. Cl.
*G06K 9/36* (2006.01)
(52) U.S. Cl.
USPC ...................................... 375/240.15; 382/238
(58) Field of Classification Search
USPC ............. 375/240.01, 240.03, 240.09, 240.15; 382/233, 236
See application file for complete search history.

(56) References Cited

U.S. PATENT DOCUMENTS

| | | | | |
|---|---|---|---|---|
| 7,414,549 | B1 * | 8/2008 | Yang et al. | 341/50 |
| 2002/0037037 | A1 * | 3/2002 | Van Der Schaar | 375/240.1 |
| 2004/0131118 | A1 * | 7/2004 | Kim et al. | 375/240.12 |
| 2005/0013365 | A1 * | 1/2005 | Mukerjee et al. | 375/240.16 |
| 2005/0053149 | A1 * | 3/2005 | Mukerjee et al. | 375/240.16 |
| 2005/0195897 | A1 * | 9/2005 | Cha | 375/240.12 |
| 2006/0045184 | A1 * | 3/2006 | Vetro et al. | 375/240.16 |
| 2006/0133521 | A1 * | 6/2006 | Sampath et al. | 375/260 |
| 2007/0253479 | A1 * | 11/2007 | Mukherjee | 375/240.1 |

OTHER PUBLICATIONS

Fu, et al. Efficient Reverse-Play Algorithms for MPEG Video With VCR Support. In: IEEE Transactions on Circuits Systems for Video Technology, vol. 16, pp. 19-30, Jan. 2006. http://ieeexplore.ieee.org/Xplore/login.jsp?url=/iel5/76/33196/01564120.pdf?tp=&arnumber=1564120&isnumber=33196. Last accessed Sep. 25, 2008, 12 pages.

Fang, et al. An Error-Resilient GOP Structure for Robust Video Transmission. In: IEEE Transactions on Multimedia, vol. 7, Issue 6, Dec. 2005, pp. 1131-1138. http://ieeexplore.ieee.org/application/mdl/mdlconfirmation.jsp?arnumber=01542090. Last accessed Sep. 25, 2008, 8 pages.

Lin, et al. MPEG Video Streaming with VCR Functionality. In: IEEE Transactions on Circuits and Systems for Video Technology, vol. 11, Issue 3, Date: Mar. 2001, pp. 415-425. http://ieeexplore.ieee.org/iel5/76/19666/00911165.pdf?tp=&arnumber=911165&isnumber=19666. Last accessed Sep. 25, 2008, 11 pages.

Ip, et al. Adopting SP/SI-Frames in Dual-Bitstream Video Streaming with VCR Support. In: IEEE International Conference on Acoustics, Speech and Signal Processing, 2006. ICASSP 2006, vol. 2. http://ieeexplore.ieee.org/iel5/11024/34758/01660401.pdf?tp=&arnumber=1660401&isnumber=34758. Last accessed Sep. 25, 2008, 4 pages.

(Continued)

*Primary Examiner* — Michael Thier
*Assistant Examiner* — Prince A Mensah
(74) *Attorney, Agent, or Firm* — Turocy & Watson, LLP

(57) ABSTRACT

Efficient encoding and/or decoding of digital video is provided using multiple candidate reference frames, making playback of the digital video optionally reversible. For example, a source can be encoded as duplex coded frames having multiple candidate reference frames. The reference frames can be previous or future frames, and the duplex coded frames can be encoded at a bit-rate that ensures lossless decoding using any of the candidate reference frames. Therefore, the duplex coded frames can encoded in normal and/or reverse temporal order. In this regard, the ability to decode digital video frames using either a single previous or future frame enables reversible digital video, bit-stream switching and video splicing arbitrary time points, and provides for increased error resilience.

22 Claims, 14 Drawing Sheets

(56) References Cited

OTHER PUBLICATIONS

Wyner, et al. The Rate-Distortion Function for Source Coding with Side Information at the Decoder http://ieeexplore.ieee.org/iel5/18/22688/01055508.pdf?tp=&arnumber=1055508&isnumber=22688. Last accessed Sep. 25, 2008, 10 pages.

Slepian, et al. Noiseless Coding of Correlated Information Sources, IEEE Transactions on Information Theory, vol. 19, Issue 4, Jul. 1973 pp. 471-480. http://ieeexplore.ieee.org/iel5/18/22670/01055037.pdf?tp=&arnumer=1055037&isnumber=22670. Last accessed Sep. 25, 2008, 10 pages.

Varodayan, et al. Rate-Adaptive Codes for Distributed Source Coding. In: EURASIP Signal Processing Journal, Special Section on Distributed Source Coding, vol. 86, pp. 3123-3130, 2006 http://www.stanford.edu/~bgirod/pdfs/Varodayan_EURASIPSignalProcessing06.pdf. Last accessed Sep. 25, 2008, 8 pages.

Wee. Revesring Motion Vector Fields. In: IEEE International Conference on Image Processing, Chicago, IL, Oct. 1998. http://citeseerx.ist.psu.edu/viewdoc/summary?doi=10.1.1.25.2785. Last accessed Sep. 25, 2008, 4 pages.

\* cited by examiner

FLEXIBLE WYNER-ZIV VIDEO FRAME CODING

TECHNICAL FIELD

The following description relates generally to digital video coding, and more particularly to techniques for encoding/decoding Wyner-Ziv frames using selected candidate reference frame(s).

BACKGROUND

The evolution of computers and networking technologies from high-cost, low performance data processing systems to low cost, high-performance communication, problem solving, and entertainment systems has increased the need and desire for digitally storing and transmitting audio and video signals on computers or other electronic devices. For example, everyday computer users can play/record audio and video on personal computers. To facilitate this technology, audio/video signals can be encoded into one or more digital formats. Personal computers can be used to digitally encode signals from audio/video capture devices, such as video cameras, digital cameras, audio recorders, and the like. Additionally or alternatively, the devices themselves can encode the signals for storage on a digital medium. Digitally stored and encoded signals can be decoded for playback on the computer or other electronic device. Encoders/decoders can use a variety of formats to achieve digital archival, editing, and playback, including the Moving Picture Experts Group (MPEG) formats (MPEG-1, MPEG-2, MPEG-4, etc.), and the like.

Additionally, using these formats, the digital signals can be transmitted between devices over a computer network. For example, utilizing a computer and high-speed network, such as digital subscriber line (DSL), cable, T1/T3, etc., computer users can access and/or stream digital video content on systems across the world. Since the bandwidth for such streaming is typically not as large as local access and because processing power is ever-increasing at low costs, encoders/decoders often attempt to require more processing during the encoding/decoding steps to decrease the amount of bandwidth required to transmit the signals.

Accordingly, encoding/decoding methods have been developed, such as motion estimation (ME) and inter-frame prediction to provide pixel or region prediction based on a previous reference frame, thus reducing the amount of pixel/region information that should be transmitted across the bandwidth. Typically, such a scheme results in a decoding dependency, wherein each inter frame is dependent on all of its reference frames in order for proper decoding. This dependency complicates the reverse play operation and causes error propagation when video is transmitted over error prone channels.

SUMMARY

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one embodiment, Wyner-Ziv frame encoding includes encoding each frame as a duplex Wyner-Ziv frame or M-frame. The frames are encoded having a set of reference frame(s), and the reference frames can include previous frame(s), future frame(s) and/or a combination thereof. Each frame is subsequently encoded at a minimum bit-rate, which is the bit-rate necessary for lossless decoding of the M-frames using any of the reference frames. Consequently, the M-frames can be decoded even if only one of the reference frames is available at the decoder.

The ability to decode a M-frame using only one reference frame enables reverse playback, fast forward playback, error resilience, bit-stream switching, and video splicing at arbitrary time points. For example, where the encoded frame is n, the candidate reference frames can be n−1 and n+1. Frame n can be decoded as long as either frame n−1 or frame n+1 is available at the decoder. Additionally, the ability to decode in normal and reverse temporal order mitigates against error propagation, and allows for video spliced at arbitrary time points to be reconstructed.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

Efficient encoding and/or decoding of reversible digital video are provided using multiple candidate reference frames. For example, a source can be encoded as duplex coded frames having multiple candidate reference frames. The reference frames can be previous or future frames, and the duplex coded frames can be encoded at a bit-rate that ensures successful decoding using any of the candidate reference frames. Therefore, the duplex coded frames can be encoded in normal and/or reverse temporal order.

In one example, successful decoding in normal and/or reverse temporal order enables increased error resilience. When a frame is lost the preceding frames can be decoded in normal temporal order, and frames following the lost frame can be decoded in reverse temporal order. Moreover, for similar reasons, decoding in normal and/or reverse temporal order provides for bit-stream switching and video splicing at arbitrary time points.

Various aspects of the subject disclosure are now described with reference to the annexed drawings, wherein like numerals refer to like or corresponding elements throughout. It should be understood, however, that the drawings and detailed description relating thereto are not intended to limit the claimed subject matter to the particular form disclosed. Rather, the intention is to cover all modifications, equivalents and alternatives falling within the spirit and scope of the claimed subject matter.

Figure 1:
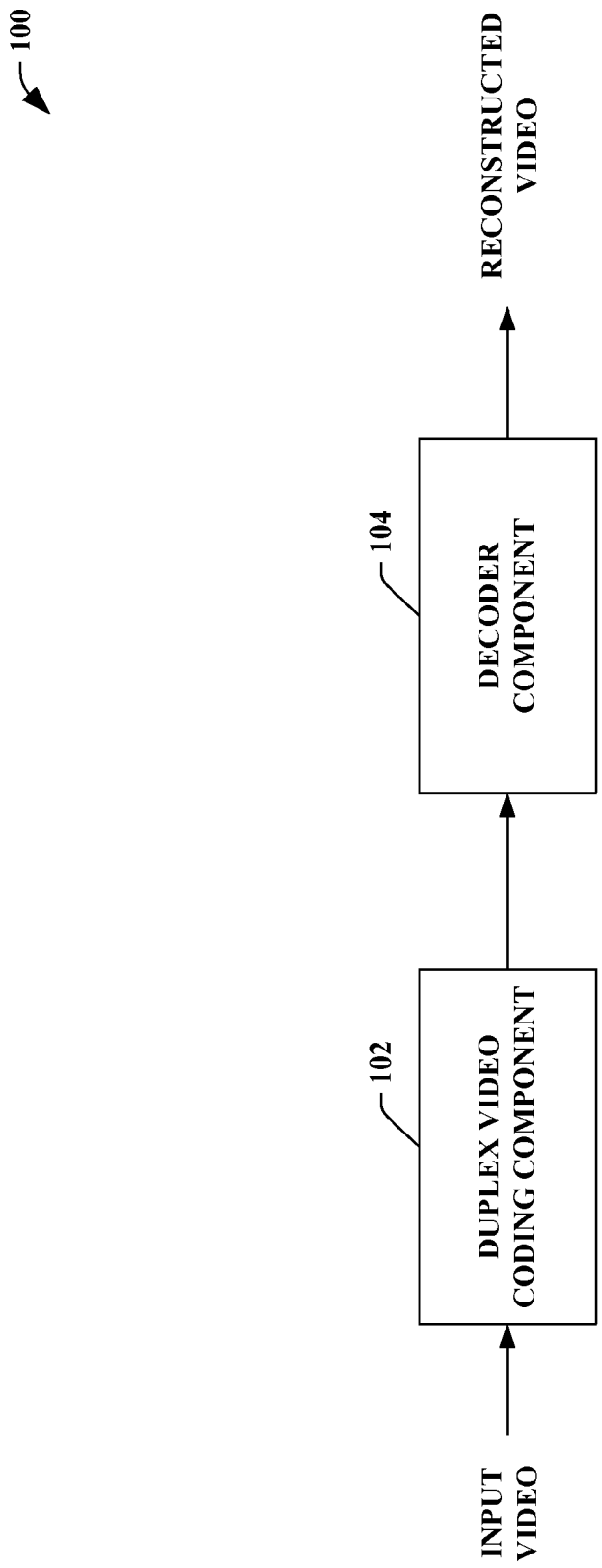
FIG. 1 illustrates a block diagram of an exemplary system that facilitates encoding/decoding reversible duplex encoded frames using multiple candidate reference frames in accordance with the subject invention.

Now turning to the figures, FIG. 1 illustrates a system 100 that facilitates encoding/decoding reversible digital video using multiple candidate reference frames. The system 100 includes a duplex video coding component 102 that encodes digital video to duplex coded frames, and a decoder component 104 that can decode the duplex coded frames in normal and/or reverse temporal order. Additionally or alternatively, the decoder component 104 can decode the duplex coded frames using at least one frame included in the set of multiple candidate reference frames. For example, the set of multiple candidate reference frames can include two frames, the two frames being a previous frame and a future frame. Where the encoded frame is n, the candidate reference frames can be n−1 and n+1. Frame n can be decoded as long as either frame n−1 or frame n+1 is available at the decoder component 104. It is appreciated that the invention can be implemented with other and/or additional candidate reference frames as well.

The duplex video coding component 102 can encode video to duplex coded frames using a two pass algorism. For example, in a first pass the duplex video coding component 102 can encode frames contained in a current group of pictures (GOP) in the normal (e.g. forward) temporal order. For each bit-plane, the duplex video coding component 102 generates a full length scalable SWC code (e.g. punctured Turbo code, rate adaptive LDPC code, etc.), as discussed in greater detail below. Additionally, for each bit-plane the coding component 102 determines a first minimum bit-rate necessary to ensure lossless reconstruction. During the first pass only a set of motion vectors (MV) and block partition modes (block modes or modes) are written into the bit-stream.

In a second pass, the coding component 102 encodes the duplex coded frames in reverse temporal order (e.g. backwards). Similar to the first pass, the coding component 102 determines a second minimum bit-rate to ensure lossless reconstruction for each bit-plane. A final bit-rate is determined by selecting the greater of the first minimum bit-rate and the second minimum bit-rate. Subsequently, the coding component 102 can write the bits of the full length scalable code corresponding to the final bit-rate to the bit-stream. For example, if the minimum bit-rate equals N then the full length scalable code is scaled to the minimum bit-rate by selecting the first N bits of the scalable code. These bits are sufficient for the decoder 104 to decode the bit-plane using either the forward prediction frame or the reverse prediction frame. Additionally, during the second pass the coding component 102 can predict the reverse MV and block modes using the forward MV and block modes. The reverse MV and block modes can be encoded using an entropy coding method (e.g. Huffman code, arithmetic coding, etc.).

The duplex coded frames provide increased error resilience in comparison to traditional coding systems and methodologies when transmitted over error-prone channels. For example, if a frame is lost the frames preceding the lost frame can be decoded in normal temporal order, and the frames following the lost frame can be decoded in reverse temporal order. In a traditional inter-frame structure the decoding technique requires dependency of each coded frame on all of its reference frames, whereas the duplex coded frames can be decoded even when only one of the multiple candidate reference frames is available at the decoder component 104. An error in a traditional encoding structure will propagate through subsequently decoded frames, whereas an error or lost frame in the duplex coded frame structure does not propagate. The duplex coded frame structure enables a frame preceding a lost frame or error to be correctly decoded using past reference frames, and a frame following a lost frame or error can be correctly decoded using future reference frames.

Moreover, the duplex coded frames enable video splicing and bit-stream switching at arbitrary times points. For example, a first bit-stream and a second bit-stream can be separated from their original bit-streams and spliced together at an arbitrary time point to form a new bit-stream. The decoder component 104 can exploit the forward and reverse decoding capability of the duplex coded frames to reconstruct the new bit-stream. The duplex coded frames enable video splicing at arbitrary time points for the same reasons that the duplex coded frame structure demonstrates error resilience. As previously discussed, in a traditional inter frame structure the decoding technique requires inter frame dependency of each inter frame on all of its reference frames. However, duplex coded frames can be decoded using preceding or following frames. Similarly, the decoding structure of the duplex coded frames enables bit-stream switching at arbitrary time points as well.

Figure 2:
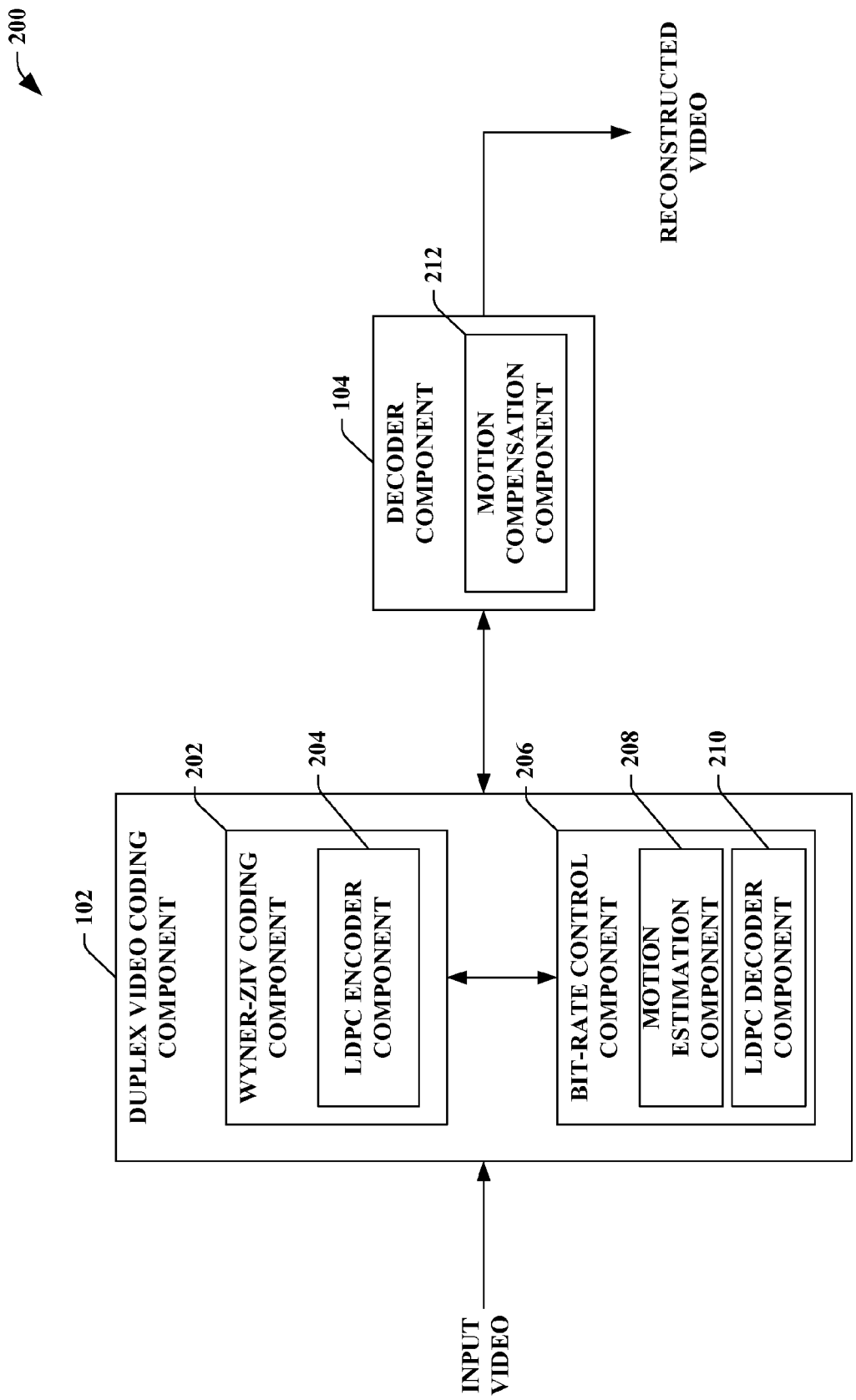
FIG. 2 illustrates a block diagram of an exemplary system that facilitates encoding/decoding reversible duplex encoded frames using multiple candidate reference frames in accordance with the subject invention.

FIG. 2 illustrates a system 200 that facilitates encoding/decoding reversible digital video with multiple candidate reference frames. The system 200 includes a duplex video coding component 102 that encodes digital video, and a decoder component 104 that can decode the duplex coded frames in normal and/or reverse temporal order. The duplex video coding component 102 includes a Wyner-Ziv coding (WZC) component 202 that can encode video as duplex Wyner-Ziv frames (M-frames). Each block of an input frame is transformed into the frequency domain, and the WZC component 202 quantizes the input frequency coefficients X(i) into input bit-planes B(i, k). Where i is the order of the scan (e.g. zigzag scan), and k is the bit-plane index. For example, i=0 can represent the direct current (DC) component and k=0 can represent the most significant bit-plane. It is to be appreciated that a block can be, for example, a pixel, a collection of pixels, or substantially any portion of a video frame.

The WZC component 202 includes a rate adaptive low density parity check (LDPC) encoder component 204, the LDPC encoder component 204 can encode each bit-plane at a minimum bit-rate that ensures the bit-planes can be lossless decoded. For each bit-plane, the LDPC encoder 204 generates a rate adaptive LDPC code, discussed in greater detail below. The minimum bit-rate can be determined by a bit-rate control component 206 included in the duplex video coding component 102.

The bit-rate control component 206 includes a motion estimation component 208 that can determine a set of prediction frames based on a set of candidate reference frames. For example, the motion estimation component 208 can determine a first and second prediction frame based on a first and second reference frame, respectively. Wherein, the frequency coefficient of the first prediction can be represented as $Y_0(i)$, and the frequency coefficient of the second prediction frame can be represented by $Y_1(i)$. It is appreciated that there can be additional candidate reference frames, and the candidate reference frames can be previous frames, future frames, and/or a combination thereof.

Additionally, the bit-rate control component 206 includes a LDPC decoding component 204 that can decode the input bit-planes $B(i, k)$ using the frequency coefficients $Y_0(i, k)$ and $Y_1(i, k)$ of the prediction frames by considering them noisy versions of the input frequency coefficients $X(i)$. For each, input bit-plane $B(i, k)$ the LDPC decoding component 204 can use the frequency coefficients of the prediction frames to determine the log likelihood ratio and perform belief propagation to attain a reconstruction of the input bit-planes $B(i, k)$. For example, the LDPC decoding component 204 can determine $B_0(i, k)$ based on a determination of the log likelihood ratio using $Y_0(i)$ and belief propagation based LDPC decoding. Similarly, the LDPC decoding component 204 can determine $B_1(i, k)$ based on a determination of the log likelihood ratio using $Y_1(i)$ and belief propagation based LDPC decoding.

Once reconstructions of the input bit-planes have been attained, the bit-rate control component 206 increases the minimum bit-rate until the reconstructions of the input bit-plane are the same as the input bit-planes. For example, the bit-rate control component 206 can increase the minimum bit-rate $R(i, k)$ until both $B_0(i, k)$ and $B_1(i, k)$ are the same as $B(i, k)$. The bit-rate $R(i, k)$ where $B_0(i, k)$ and $B_1(i, k)$ equal $B(i, k)$ is the minimum bit-rate at which $B(i, k)$ can be loseless decoded using either $Y_0(i)$ or $Y_1(i)$ as decoder side information. Additionally or alternatively, the rate control component 206 can estimate or calculate the minimum bit-rate $R(i, k)$ at which $B(i, k)$ can be loseless decoded. For example, the rate control component 206 can estimate the minimum bit-rate $R(i, k)$ by calculating the source statistics of the joint source $(X, B, Y_0, Y_1)$, or calculating conditional probabilities and entropies using the information theory method.

The decoder component 104 includes a motion compensation component 212. The motion compensation component 212 performs motion compensation on the reference frames available at the decoder, and each block of the reference frame is transformed into frequency domain by the decoder component 104. Subsequently, the decoder component 104 using the frequency coefficients of the reference frames can perform belief propagation, similar to the LDPC decoding during encoding, to attain a reconstruction for each bit-plane. For example, if the first reference frame is available at the decoder component 104 then the decoder component 104 can perform belief propagation using $Y_0(i)$ to attain the reconstruction $B_0(i)$. Since the minimum bit-rate determined by the bit-rate control component 206 ensures that $B_0(i, k)=B_1(i, k)=B(i, k)$, the decoder component 104 can lossless decode the input bit-plane using at least one reference frame from the set of candidate reference frames.

Consequently, the system 200 enables decoding digital video in reverse temporal order (e.g. backwards). For example, the set of multiple candidate reference frames can include two frames, the two frames being a previous frame and a future frame. Where the encoded frame is t, the candidate reference frames can be t−1 and t+1. Frame t can be decoded as long as frame t−1 or frame t+1 is available at the decoder component 104. Additionally, the candidate reference frames can be t−x and t+y, wherein x and y are integers.

Furthermore, the system 200 provides increased error resilience when transmitted over error-prone channels. For example, if a current group of pictures (GOP) includes a set of frames (e.g. 9 frames) and a frame (e.g. frame 6) is lost, the frames preceding the lost frame (e.g. frames 1-5) can be decoded in normal temporal order, and the frames following the lost frame frames (e.g. frames 7-8) can be decoded in reverse temporal order. As noted supra, in a traditional inter-frame structure the decoding technique requires dependency of each encoded frame on all of its reference frames, whereas the M-frames can be decoded using at least one frame included in the set of multiple candidate reference frames. An error in a traditional encoding structure will propagate through subsequently decoded frames, whereas an error or lost frame in the duplex coded frame structure does not propagate. The duplex coded frame structure enables a frame preceding a lost frame or error to be correctly decoded using past reference frames, and a frame following a lost frame or error can be correctly decoded using future reference frames.

In addition, the duplex M-frames enable video splicing and bit-stream switching at arbitrary times points. For example, a first bit-stream and a second bit-stream can be separated from their original bit-streams and spliced together at an arbitrary time point to form a new bit-stream. The M-frames can exploit the forward and reverse decoding capability to reconstruct the new bit-stream. The M-frames enable video splicing at arbitrary time points for reasons similar to the M-frames demonstrated error resilience. As previously discussed, in a traditional inter frame structure the decoding technique requires inter frame dependency of each inter frame on all of its reference frames. However, duplex coded frames can be decoded using preceding or following frames. Similarly, the decoding structure of the duplex coded frames enables bit-stream switching at arbitrary time points as well.

Figure 3:
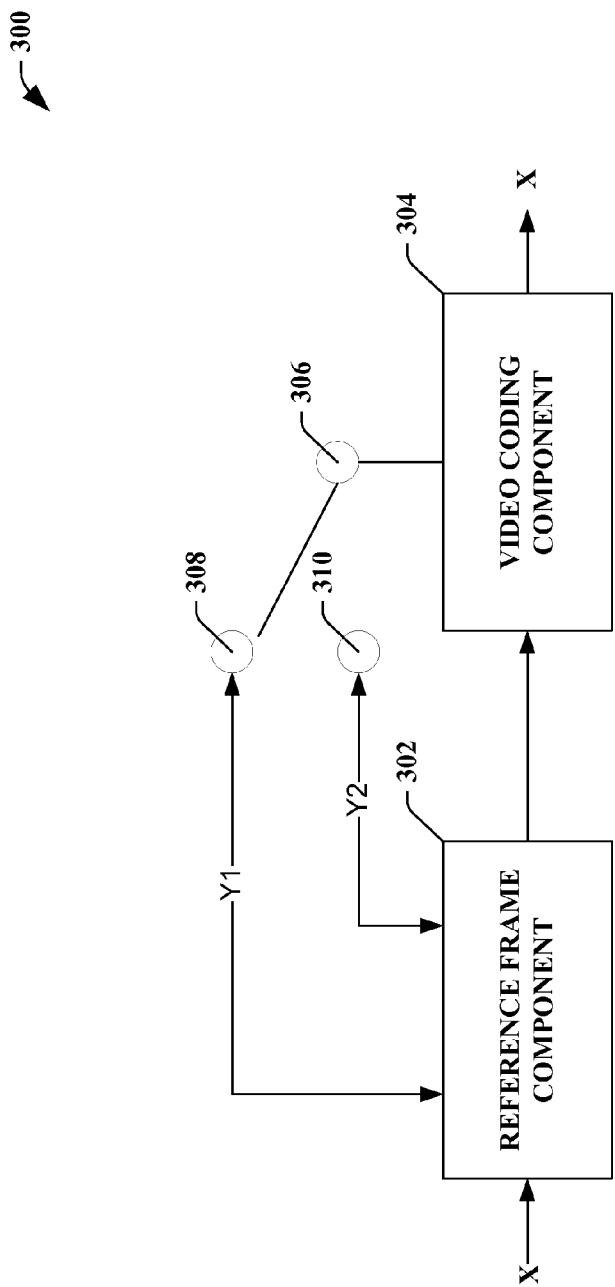
FIG. 3 illustrates a block diagram of an exemplary system that facilitates digitally encoding/decoding reversible Wyner-Ziv frames using multiple candidate reference frames in accordance with the subject invention.

FIG. 3 illustrates a system 300 that facilitates digitally encoding/decoding reversible digital video with multiple candidate reference frames in accordance with an aspect of the subject invention. The system 300 includes an encoder 302, a decoder 304, a prediction frame selector 306, a first prediction frame node 308, and a second prediction frame node 310. The encoder 302 receives a source X (e.g. video) and encodes X to a digital format based at least in part on a first prediction frame $Y_1$ and a second prediction frame $Y_2$. The encoder 302 can communicate the encoded X to the decoder 304. The decoder 304 can decode the encoded X using at least one prediction frame $Y_1$ or $Y_2$. The selector 306 can enable the decoder 304 to receive either the first prediction frame $Y_1$ when connected to the first node 308, or the second prediction frame $Y_2$ when connected to the second node 310.

It is appreciated that the selector 306, first node 308, and second node 310 are merely exemplary, and can be representative of other types of control, including but not limited to forward or reverse video playback control. For example, where $Y_1$ is a frame following X and $Y_2$ is a frame preceding X, the selector 306 could be used to decode in reverse temporal order (e.g. backwards) when connected to the second node 310, or decode in normal temporal order (e.g. forward) when connected to the first node 308. Additionally, the selector 306 can be exemplary of a situation in which only one of the prediction frames $Y_1$ or $Y_2$ is available at the decoder 304. For example, where a frame has been lost, the video has been spliced, or the bit-stream has been switched.

The system 300 enables the lossless compression of the source X when only one of the two encoder predictions $Y_1$ or $Y_2$ are available at the decoder 304. When the selector 306 is connected to the first node 308 the minimum bit-rate for lossless compression according to the Slepian-Wolf theory is:

$$R^*_1 = H(X|Y_1)$$

where only $Y_1$ is available at the decoder. When the selector 306 is connected to the second node 310 the minimum bit-rate for lossless compression according to the Slepian-Wolf theory is:

$$R^*_2 = H(X|Y_2)$$

where only $Y_2$ is available at the decoder. A single code word that satisfies both cases can be used to encode X, and decode X when only one of $Y_1$ or $Y_2$ is available. The optimum bit-rate of the code word can be expressed using the equation:

$$R^* \geq \max(R^*_1, R^*_2)$$

Figure 4:
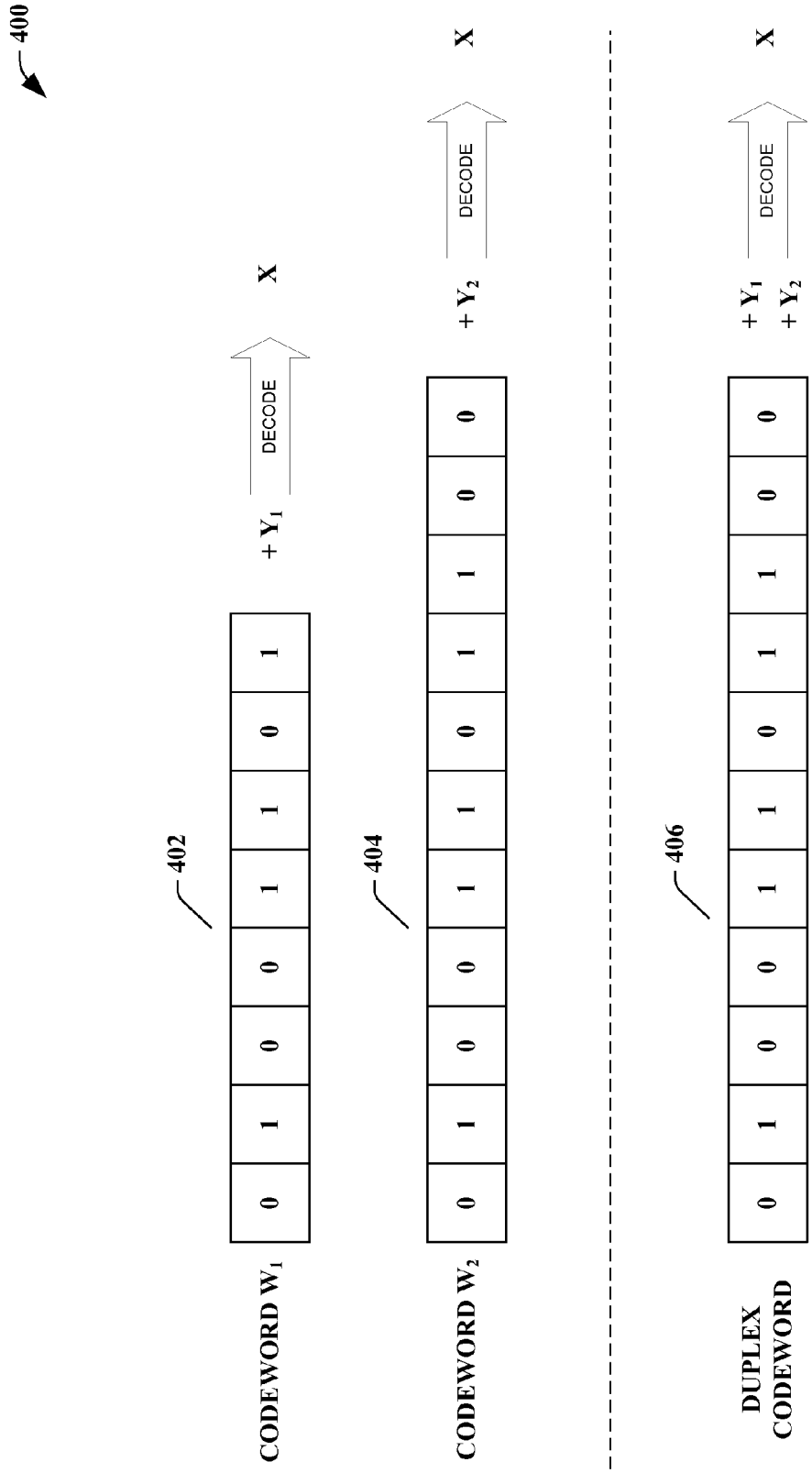
FIG. 4 illustrates an exemplary application of rate adaptive codewords in accordance with an aspect of the present invention.

Turning now to FIG. 4, an exemplary application of rate adaptive codewords is shown in accordance with an aspect of the subject invention. As previously discussed, the rate adaptive codewords (e.g. scalable SWC codes including punctured Turbo codes, rate adaptive LDPC codes, etc.) can be used to compress a source X. A first codeword $W_1$ 402 has a sufficient length (e.g. bits) to decode X using $Y_1$. A second codeword $W_2$ 404 has a sufficient length (e.g. bits) to decode X using $Y_2$. The second codeword $W_2$ 404 is longer than the codeword $W_1$ 402, and it can be assumed that codeword $W_2$ 404 contains codeword $W_1$ 402 because of the scalability of the code. Therefore, only codeword $W_2$ 404 is needed in order to decode X with either $Y_1$ or $Y_2$ at the decoder. The longer of the two codewords (e.g. codeword $W_2$ 404) is selected for decoding X.

The bit-rate of this exemplary application of rate adaptive codewords approaches the optimum bit-rate R* previously discussed. For example, suppose the length of codeword $W_1$ 402 is $R_1 = R^*_1 + e_1$, and the length of codeword $W_2$ 404 is $R_2 = R^*_2 + e_2$. Where $e_1$ and $e_2$ are the rate redundancies of the scalable SWC code. The rate of the system can be expressed by the equation:

$$R = \max(R_1, R_1)$$

where codeword $W_1$ 402 is selected when $R_1 \geq R_1$, or codeword $W_2$ 404 if $R_1 \leq R_1$. Therefore, the application approaches the optimum bit-rate as shown in the following equation:

$$R = \max(R_1, R_2) \leq \max(R^*_1, R^*_2) + \max(e_1 + e_2)$$

Additionally, the rate of redundancy is at most $e_1$ or $e_2$ (e.g. the rate of redundancy for the adopted scalable SWC codes).

Figure 5:
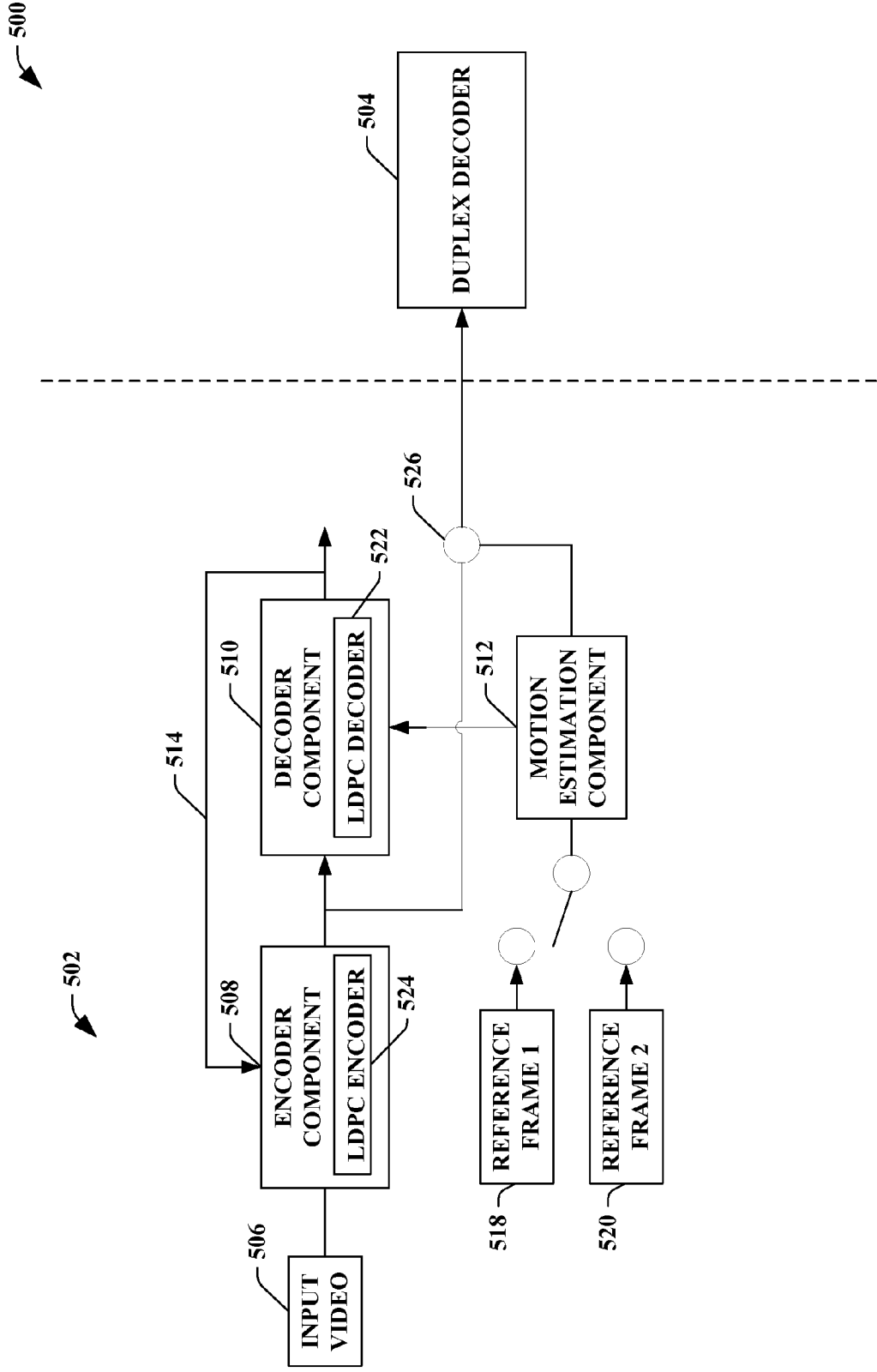
FIG. 5 illustrates a block diagram of an exemplary system that that facilitates digitally encoding/decoding reversible digital video with multiple candidate reference frames in accordance with the subject invention.

FIG. 5, illustrates a system 500 that facilitates digitally encoding/decoding reversible digital video with multiple candidate reference frames. The system 500 enables rate adaptive encoding (e.g. LDPC encoding, punctured Turbo encoding, etc.) of an input video 506 with multiple candidate reference frames, and decoding when at least one of the candidate reference frames is available at a duplex decoder 504.

The system 500 includes a duplex encoder 502 that includes an encoder 508, a feedback decoder 510, a motion estimation component 512, a rate control feedback 514, a first reference frame 518, and a second reference frame 520. The encoder 508 receives an input video 506. The input video 506 is comprised of at least one or more frames. The encoder 508 transforms each block of an input frame into the frequency domain, and quantizes the frequency coefficients X(i) into bit-planes B(i, k).

The motion estimation component 512 estimates or predicts the motion of a first reference frame 518 and a second reference frame 520 to determine a first and second prediction frame. The feedback decoder 510 transforms each block of the prediction frames into the frequency domain. The frequency coefficients of the first prediction block can be represented as $Y_0(i)$, and the frequency coefficients of the second prediction block can be represented as $Y_1(i)$. The feedback decoder 510 includes a rate adaptive decoder (e.g. LDPC decoder) 522 that can use the frequency coefficients $Y_0(i)$ and $Y_1(i)$ to decode the input video by considering them noisy versions of the frequency coefficients of the input frame X(i).

The rate adaptive decoder 522 can determine a log likelihood ratio and perform belief propagation for each original bit-plane of the input video 506, using the frequency coefficients $Y_0(i)$ and $Y_1(i)$ of the prediction frames 518, and 520 to reconstruct the original bit-planes B(i, k). For example, the rate adaptive decoder 522 determines the log likelihood ratio and performs belief propagation for each bit-plane B(i, k) using the frequency coefficients $Y_0(i)$ of the first prediction frame 518 to determine a reconstruction of the bit-planes $B_0(i, k)$. Similarly, the rate adaptive decoder 522 determines another reconstruction of the bit-planes $B_1(i, k)$ using the frequency coefficients $Y_1(i)$ of the second prediction frame 520. The minimum bit-rate at which the original bit-plane B(i, k) can be lossless decoded with either $Y_0(i)$ or $Y_1(i)$ available at the decoder 510 is determined by increasing the bit-rate until the reconstructed bit-planes $B_0(i, k)$ and $B_1(i, k)$ are equal to the original bit-plane B(i, k), as represented by the equation: $B_0(i, k) = B_1(i, k) = B(i, k)$. Additionally or alternatively, the minimum bit-rate R(i, k) at which B(i, k) can be loseless decoded can be estimated or calculated. For example, the minimum bit-rate R(i, k) can be determined by calculating the source statistics of the joint source (X, B, $Y_0$, $Y_1$), or calculating conditional probabilities and entropies using the information theory method. The minimum bit-rate is communicated to the encoder 508 via the rate control feedback 514.

The encoder 508 receives the minimum bit-rate for each bit-plane via the rate control feedback 514. The rate adaptive encoder 524 determines the scalable SWC codes (e.g. LDPC codes, punctured Turbo codes, etc.) that are written to the bit-stream 526 based on the minimum bit-rate. Additionally, the motion information of the two reference frames can be encoded via an entropy coding method (e.g. Huffman code, arithmetic code, etc.).

The duplex decoder 504 can receive the bit-stream 526 and decode or reconstruct the bit-planes B(i, k) using either the first reference frame 518 or second reference frame 520. The decoder performs motion compensation, and transforms each block of the reference frame into the frequency domain, which yields either $Y_0(i)$ or $Y_1(i)$ depending on which reference frame is available. Subsequently, the decoder 504 performs belief propagation (e.g. LDPC decoding) using the frequency coefficients $Y_0(i)$ or $Y_1(i)$ of either the first of second reference frame. The minimum bit-rate ensures that a reconstruction of the bit-plane using the first reference frame is equivalent to a reconstruction of the bit-plane using the second reference frame, and that both are the same as the original bit-plane. Therefore, the decoder 504 can reconstruct the frame even if one of the reference frames is unavailable at the decoder.

As noted supra, the system 500 enables decoding digital video in reverse temporal order (e.g. backwards). For example, the set of multiple candidate reference frames can include two frames, the two frames being a previous frame and a future frame. Where the encoded frame is t, the candidate reference frames can be t−1 and t+1. Frame t can be decoded as long as frame t−1 or frame t+1 is available at the rate adaptive decoder 504. Additionally, the candidate reference frames can be t−x and t+y, wherein x and y are integers.

Also, the system 500 provides increased error resilience when transmitted over error-prone channels. For example, if a current group of pictures (GOP) includes 9 frames and frame 6 is lost, the frames preceding the lost frame, frames 1-5, can be decoded in normal temporal order, and the frames following the lost, frames 7-8, can be decoded in reverse temporal order. In a traditional inter-frame structure the decoding technique requires dependency of each inter frame on all of its reference frames, whereas the system 500 enables decoding using at least one frame included in the set of multiple candidate reference frames. An error in a traditional encoding structure will propagate through subsequently decoded frames, whereas the duplex encoded frame structure provides for reduced error propagation.

In addition, the rate adaptive encoded frames enable video splicing and bit-stream switching at arbitrary times points. For example, a first bit-stream and a second bit-stream can be separated from their original bit-streams and spliced together at an arbitrary time point to form a new bit-stream. The rate adaptive encoded frames can exploit the forward and reverse decoding capability to reconstruct the new bit-stream. The rate adaptive encoded frames enable video splicing at arbitrary time points for reasons similar to the rate adaptive encoded frames demonstrated error resilience. As previously discussed, in a traditional inter frame structure the decoding technique requires inter frame dependency of each inter frame on all of its reference frames. However, duplex coded frames can be decoded using preceding or following frames. Similarly, the decoding structure of the rate adaptive encoded frames enables bit-stream switching at arbitrary time points as well.

In view of the exemplary systems described supra, methodologies that may be implemented in accordance with the disclosed subject matter will be better appreciated with reference to the flow charts of FIGS. 6-10. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter.

Figure 6:
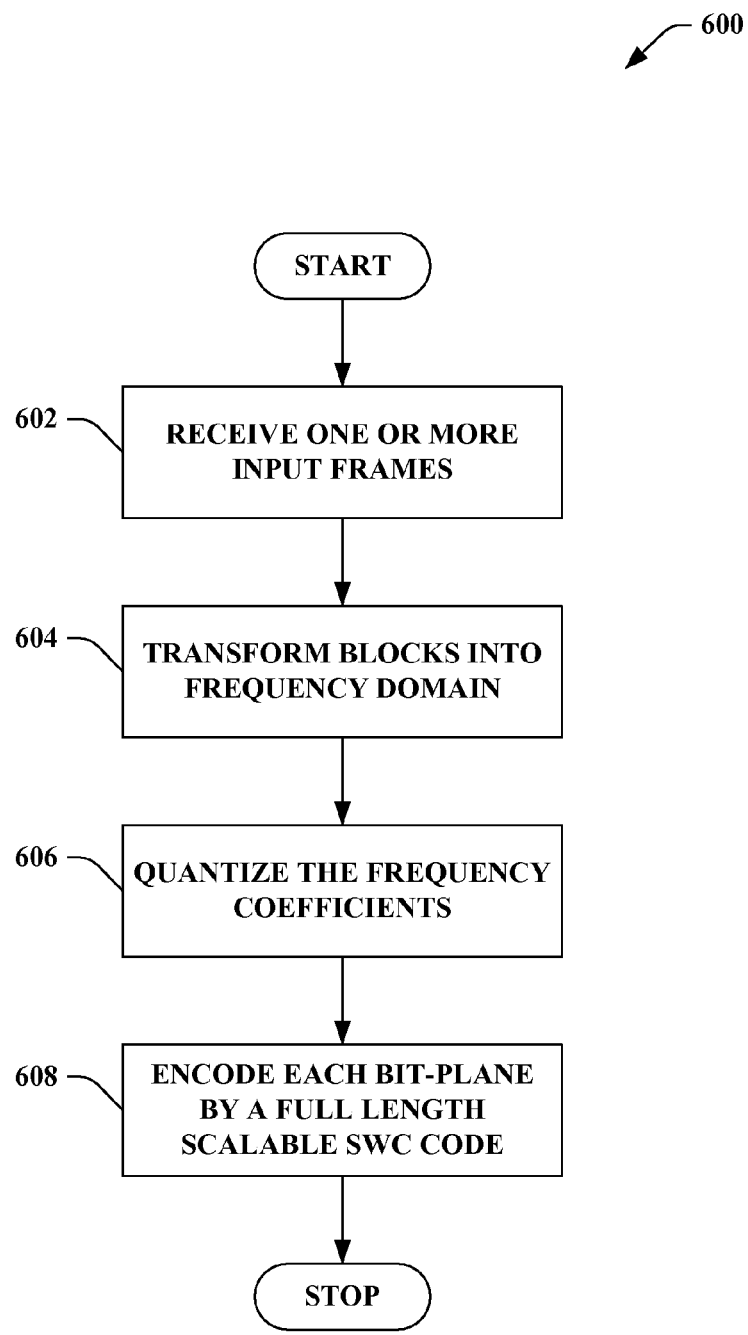
FIG. 6 illustrates an exemplary flow chart for encoding video as duplex Wyner-Ziv frames in accordance with an aspect of the present invention.

FIG. 6 illustrates a methodology 600 that facilitates encoding video as duplex Wyner-Ziv frames (M-frame or duplex M-frame). At 602 an input frame can be received, the input frame is comprised of one or more blocks. It is to be appreciated that a block can be, for example, a pixel, a collection of pixels, or substantially any portion of a video frame. At 604 each block is transformed into the frequency domain. The transformation can be accomplished by a number of means commonly known in the art, including but not limited to Discrete Fourier Transform (DFT), Discrete Cosine Transform (DCT), or Modified Discrete Cosine Transform (MDCT).

At 606, the frequency coefficients of the blocks can be quantized into bit-planes. Quantization is typically accomplished by dividing each component in the frequency domain by a constant for that component, and then rounding to the nearest integer. It is appreciated that alternative and/or additional methods of quantization may be used to achieve the function of this invention. The quantization at 606 produces a bit-plane for each block. Each bit-plane can be subsequently encoded using a full length scalable SWC code (e.g. rate adaptive LDPC code, punctured Turbo code, etc.) at 608.

Figure 7:
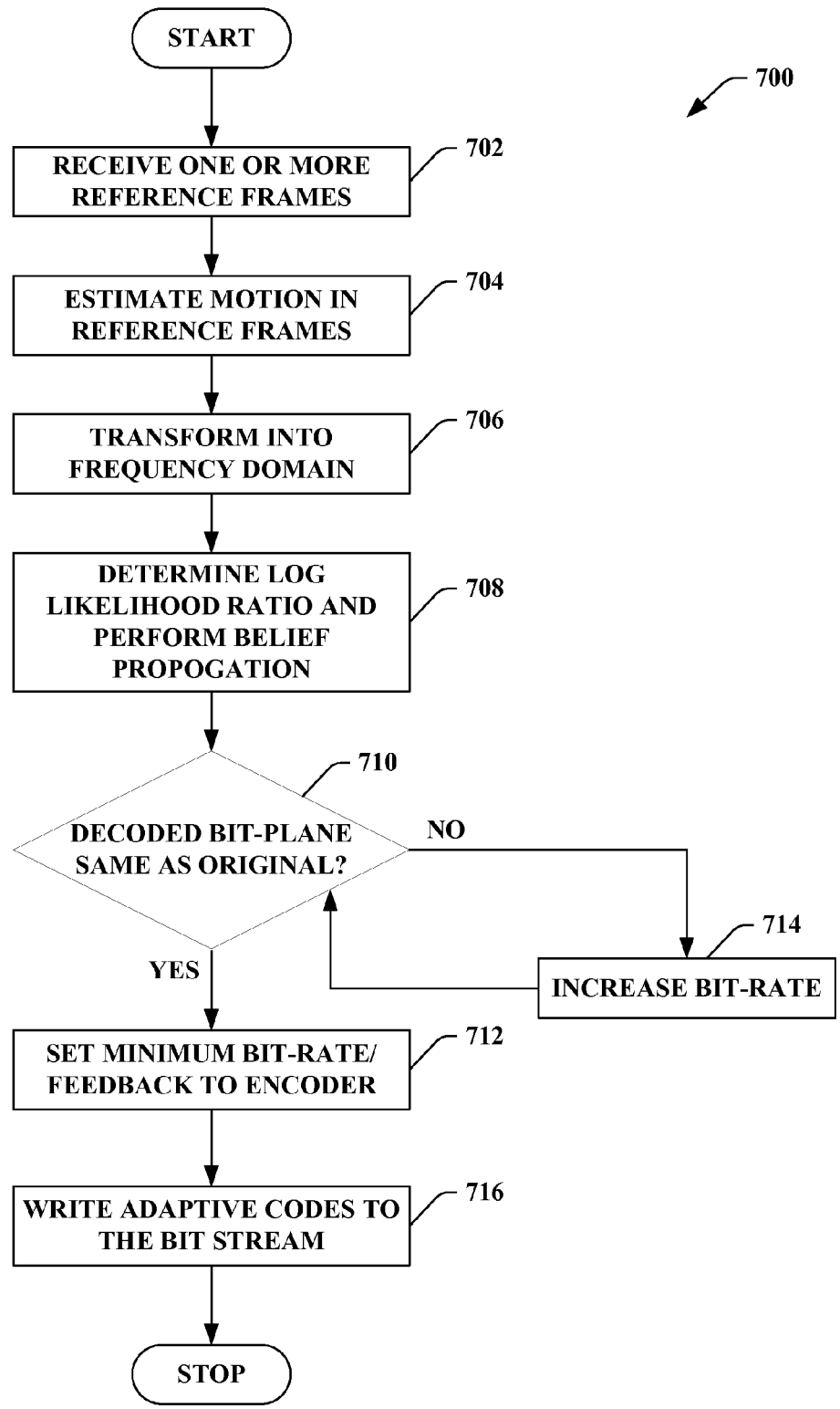
FIG. 7 illustrates an exemplary flow chart for bit-rate control of a rate adaptive encoder in accordance with an aspect of the present invention.

FIG. 7 shows a methodology 700 for bit-rate control of a rate adaptive encoder, wherein the bit-rate control is based on determining a minimum rate for lossless reconstruction of a set of bit-planes. At 702, one or more reference frames can be received. The reference frames can be previous or future frames related to a current video block. At 704, prediction frames can be determined by estimating the motion in the reference frames. The prediction frames include one or more blocks. As previously discussed, it is to be appreciated that a block can be, for example, a pixel, a collection of pixels, or substantially any portion of a video frame.

At 706 each block in the prediction frame can be transformed into the frequency domain. As noted supra, the transformation can be accomplished by a number of means commonly known in the art, including but not limited to Discrete Fourier Transform (DFT), Discrete Cosine Transform (DCT), or Modified Discrete Cosine Transform (MDCT). The frequency coefficients resulting from the transformation can be used to reconstruct each bit-plane of the input video at 708. The reconstruction is accomplished by using the frequency coefficients to determine the log likelihood ratio for each bit-plane and perform belief propagation based LDPC decoding.

A performance decision can be made, regarding the minimum bit-rate necessary to ensure lossless reconstruction of the bit-planes, by comparing the reconstructed bit-planes and the original bit-planes. At 710, it is determined if the reconstructed bit-planes are the same as the original bit-planes. If so, at 712 the highest bit-rate necessary to ensure lossless decoding for a given reconstruction is set as the minimum bit-rate for all reconstructions of those blocks. If the reconstructed bit-planes are not equal to the original bit-planes, then at 714 the bit-rate is increased and returns to 710. The method can continue to increase the bit-rate at 714 until the reconstructed bit-planes and the original bit-planes are identical. Additionally or alternatively, the minimum bit-rate can be estimated or calculated. For example, the minimum bit-rate can be determined by calculating the source statistics of the joint source $(X, B, Y_0, Y_1)$, or calculating conditional probabilities and entropies using the information theory method. When the minimum bit-rate that ensures lossless reconstruction has been determined at 712, it is feedback to the adaptive rate LDPC encoder and the LDPC codes can be written to the bit-stream at 716.

Figure 8:
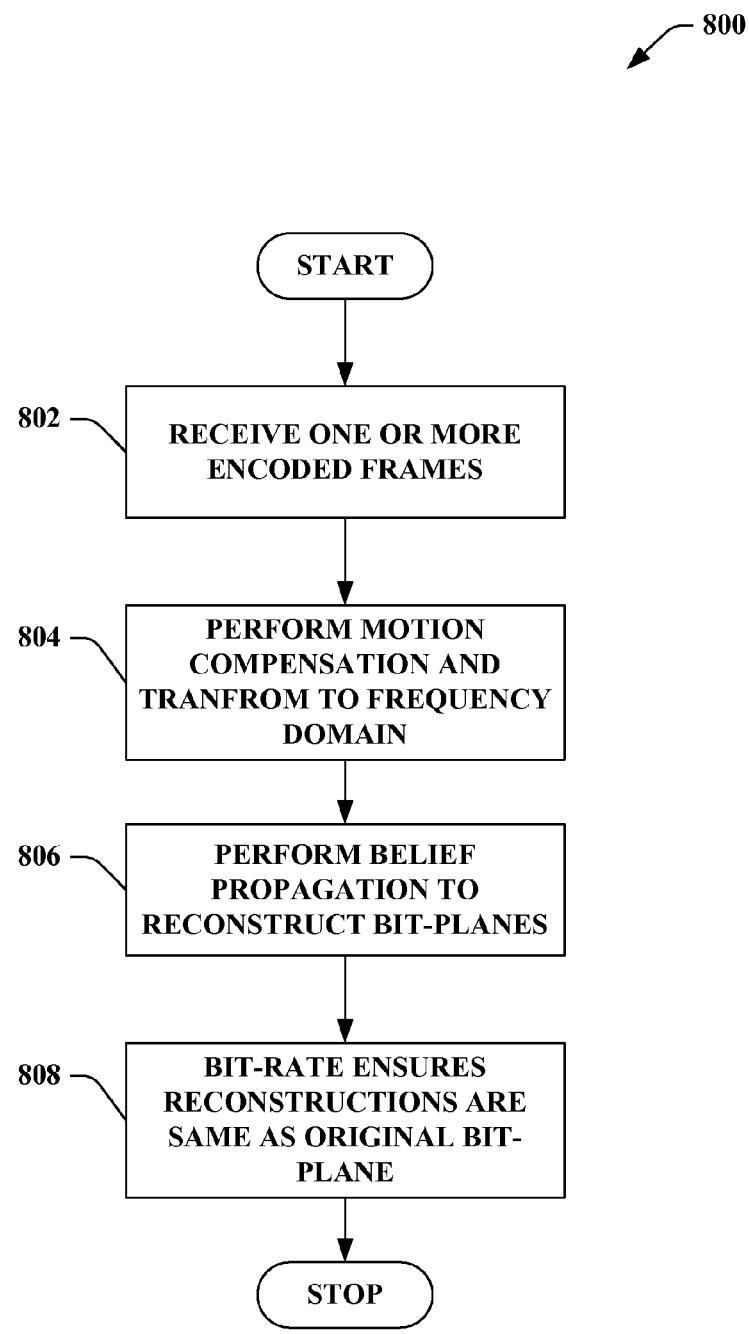
FIG. 8 illustrates an exemplary flow chart for decoding duplex Wyner-Ziv frames in accordance with an aspect of the present invention.

FIG. 8 illustrates a methodology 800 for decoding duplex Wyner-Ziv frames when all or only one reference frame is available at the decoder. At 802, one or more encoded frames can be received. As previously mentioned, the frames can be encoded as duplex Wyner-Ziv frames. At 804, motion compensation can be performed on the available prediction frames, and the prediction frames can be transformed into the frequency domain. Once in the frequency domain, belief propagation can be performed for each bit-plane to attain a reconstruction at 806. The reconstruction is guaranteed to be the same as the original, because the minimum bit-rate necessary to ensure lossless decoding was determined via rate-control during encoding, as previously discussed.

Figure 9:
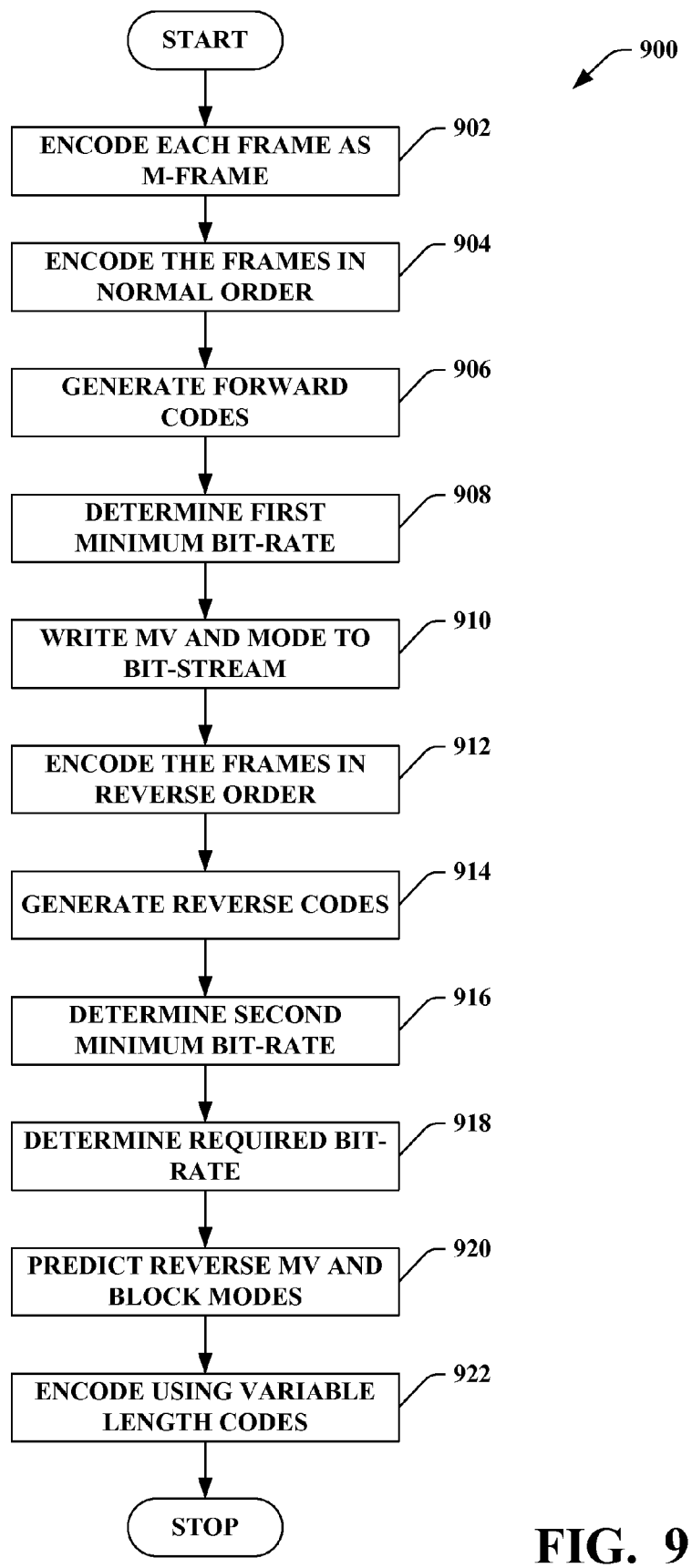
FIG. 9 illustrates an exemplary flow chart for implementing reversible Wyner-Ziv frames in accordance with an aspect of the present invention.

FIG. 9 shows a methodology 900 for implementing reversible Wyner-Ziv frames in accordance with an aspect of the subject invention. At 902, each frame is encoded as a duplex Wyner-Ziv frame (e.g. M-frame). Two candidate reference frames are selected, including a previous frame and a future frame. For example, the reconstruction of frame n−1 and n+1 would be used to decode frame n. Additionally, the candidate reference frames can be t−x and t+y, wherein x and y are integer. The methodology 900 can use a two pass algorism to implement the reversible Wyner-Ziv frames. First, the frames in a current Group of Pictures (GOP) are encoded in the normal temporal order (e.g. forward) at 904. For each bit-plane a full length scalable SWC code is generated (e.g. adaptive LDPC code, or punctured Turbo Code) at 906, and a first minimum rate necessary to ensure lossless reconstruction is determined at 908. At 910, motion vectors and block partition modes are written to the bit-stream.

Second, the frames in the current GOP are encoded in reverse temporal order (e.g. backward) at 912. At 914, again for each bit-plane a full length scalable SWC code is generated, and a second minimum rate required to guarantee lossless reconstruction is determined at 916. At 918, the minimum bit-rate is determined by selecting the greater of the first and second minimum bit-rates. This ensures that the minimum bit-rate will be sufficient to lossless decode the M-frames using either the previous or future prediction frame. At 920, the full length scalable SWC code is scaled to the minimum bit-rate and written to the bit-stream. For example, the SWC code is scaled to the minimum bit-rate by selecting the first N bits of the SWC code, where N is the minimum bit-rate.

At 922, the reverse motion vectors and block modes can be predicted using the forward motion vectors and block modes. In this way, any redundancy between the forward motion vectors and backward motion vectors can be exploited. The reverse motion vectors and block modes can be encoded using an entropy coding method (e.g. Huffman code, arithmetic code, etc.).

Figure 10:
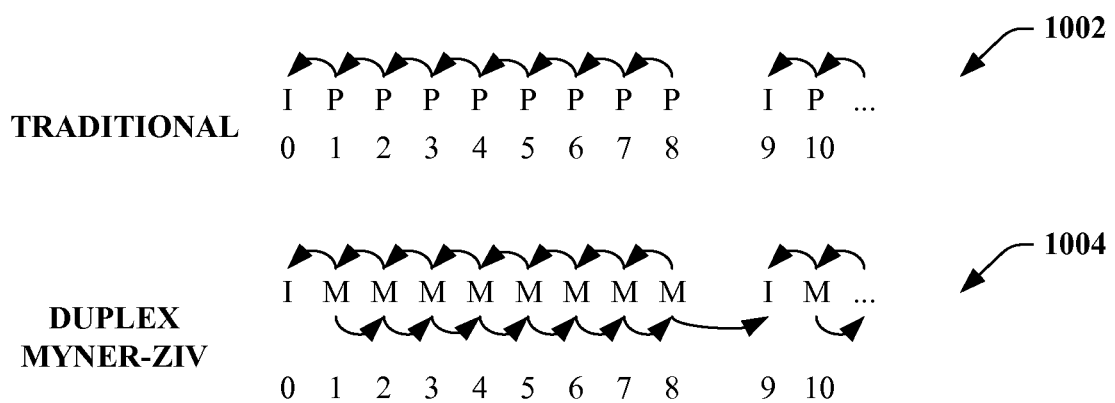
FIG. 10 illustrates an exemplary application of group of picture structures in accordance with the subject invention.

Referring now to FIG. 10, an exemplary application of GOP structures is shown in accordance with an aspect of the subject invention. The GOP structures include a traditional structure 1002 (e.g. inter-frame prediction) consisting of intra-frames (I-frames) and predicted frames (P-frames). An I-frame (e.g. key frames) is a single frame of data that an encoder examines independent of the frames that precede and/or follow it, and contains all the data necessary to decode and/or display that frame. Comparatively, a P-frame follows an I-frame and contains only the data (e.g. color, position, etc.) that changed from the preceding I-frame. Therefore, P-frames depend on the I-frames that they follow, and the traditional structure 1002 does not provide for decoding in reversal temporal order (e.g. backwards).

Additionally, the structures include the proposed reversible Wyner-Ziv frame structure 1004 consisting of I-frames and duplex Wyner-Ziv frames (M-frames). A M-frame is a single frame of data that an encoder examines in view of the frames that precede and/or follow it (e.g. reference frames), and can be decoded using any of a set of multiple candidate reference frames at the decoder. Consequently, the M-frames can be decoded in both normal and reverse temporal order, as shown.

Figure 11:
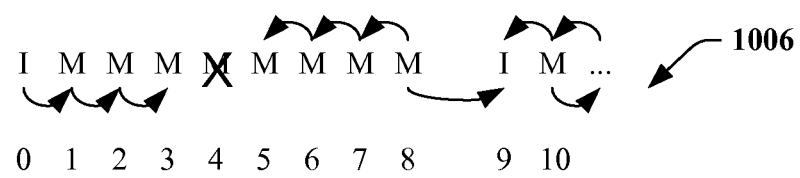
FIG. 11 illustrates an exemplary application of error resilience for reversible Wyner-Ziv frames in accordance with the subject invention.

FIG. 11 illustrates an exemplary application of error resilience for reversible Wyner-Ziv frame structure 1006 in accordance with an aspect of the subject invention. The Wyner-Ziv structure 1006 demonstrates increased error resilience when transmitted over error-prone channels. For example, if frame 4 is lost, frames 1-3 can be decoded in normal temporal order and frames 5-9 can be decoded in reverse temporal order. In a traditional inter-frame structure the decoding technique requires inter frame dependency of each inter frame on all of its reference frames, whereas a M-frame does not. This means that an error in the traditional structure will propagate, whereas an error or lost frame in the Wyner-Ziv structure E06 does not.

Figure 12:
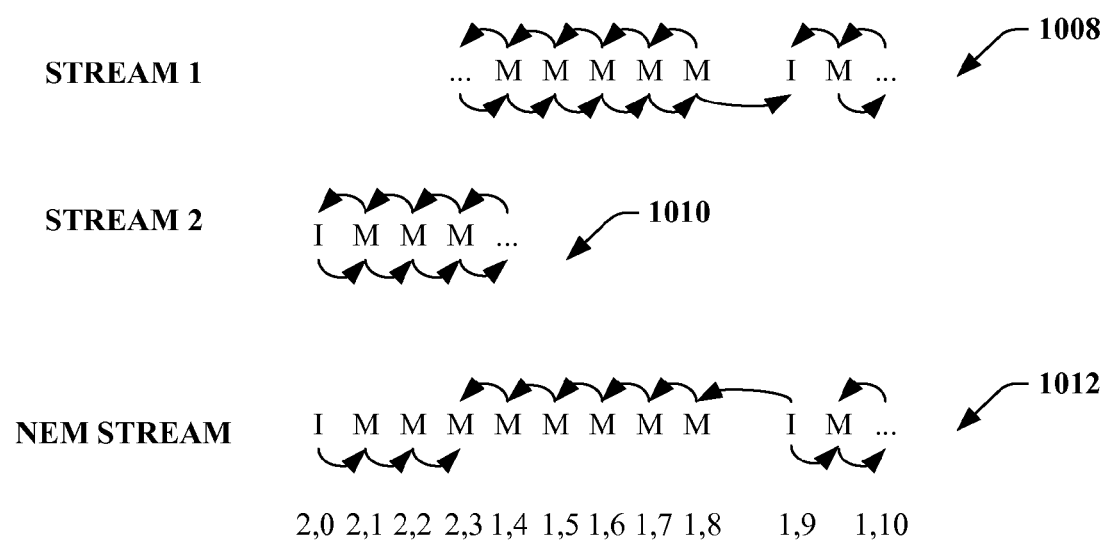
FIG. 12 illustrates an exemplary application of the video splicing and stream switching capabilities of the reversible Wyner-Ziv frame structure in accordance with the subject invention.

FIG. 12 illustrates an exemplary application of the video splicing and stream switching capabilities of the reversible Wyner-Ziv frame structure in accordance with an aspect of the subject invention. The M-frames support video splicing at arbitrary time points as shown. For example, a first stream 1008 and a second stream 1010 can be separated from their original streams between consecutive M-frames and spliced together to form a new stream 1012. The reversible Wyner-Ziv frame structure can exploit the forward and reverse decoding capability to reconstruct the new frame 1012. The M-frames enable video splicing at arbitrary time points similar to I-frames for the same reason that the reversible Wyner-Ziv structure demonstrates error resilience. As noted supra, in a traditional inter frame structure the decoding technique requires inter frame dependency of each inter frame on all of its reference frames. However, M-frames can be decoded using the preceding or following frames. Similarly, the decoding composition of the reversible Wyner-Ziv frame structure enables bit-stream switching at arbitrary time points as well.

Figure 13:
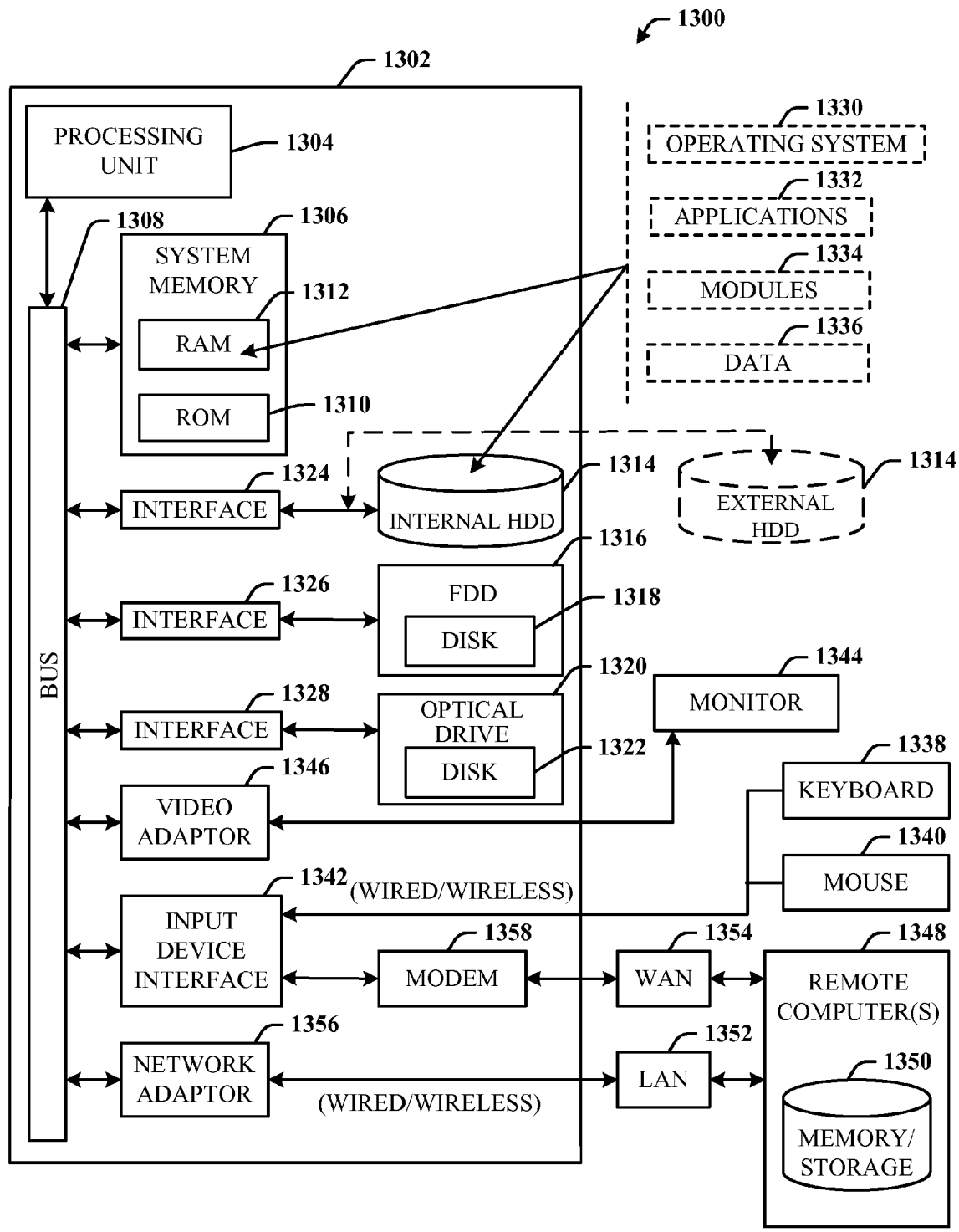
FIG. 13 a schematic block diagram illustrating a suitable operating environment in accordance with an aspect of the subject invention.

Referring now to FIG. 13, there is illustrated a block diagram of a computer operable to execute the disclosed architecture. In order to provide additional context for various aspects of the subject invention, FIG. 13 and the following discussion are intended to provide a brief, general description of a suitable computing environment 1300 in which the various aspects of the invention can be implemented. While the invention has been described above in the general context of computer-executable instructions that may run on one or more computers, those skilled in the art will recognize that the invention also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the invention may also be practiced in distributed computing environments where certain tasks are performed by remote processing devices that are linked through a communications network. In a distributed computing environment, program modules can be located in both local and remote memory storage devices.

A computer typically includes a variety of computer readable media. Computer readable media can be any available media that can be accessed by the computer and includes both volatile and nonvolatile media, removable and non-removable media. By way of example, and not limitation, computer readable media can comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

With reference again to FIG. 13, there is illustrated an exemplary environment 1300 for implementing various aspects of the invention that includes a computer 1302, the computer 1302 including a processing unit 1304, a system memory 1306 and a system bus 1308. The system bus 1308 couples system components including, but not limited to, the system memory 1306 to the processing unit 1304. The processing unit 1304 can be any of various commercially available processors. Dual microprocessors and other multi processor architectures may also be employed as the processing unit 1304.

The system bus 1308 can be any of several types of bus structure that may further interconnect to a memory bus (with or without a memory controller), a peripheral bus, and a local bus using any of a variety of commercially available bus architectures. The system memory 1306 includes read only memory (ROM) 1310 and random access memory (RAM) 1312. A basic input/output system (BIOS) is stored in a non-volatile memory 1310 such as ROM, EPROM, EEPROM, which BIOS contains the basic routines that help to transfer information between elements within the computer 1302, such as during start-up. The RAM 1312 can also include a high-speed RAM such as static RAM for caching data.

The computer 1302 further includes an internal hard disk drive (HDD) 1314 (e.g., EIDE, SATA), which internal hard disk drive 1314 may also be configured for external use in a suitable chassis (not shown), a magnetic floppy disk drive (FDD) 1316, (e.g., to read from or write to a removable diskette 1318) and an optical disk drive 1320, (e.g., reading a CD-ROM disk 1322 or, to read from or write to other high capacity optical media such as the DVD). The hard disk drive 1314, magnetic disk drive 1316 and optical disk drive 1320 can be connected to the system bus 1308 by a hard disk drive interface 1324, a magnetic disk drive interface 1326 and an optical drive interface 1328, respectively. The interface 1324 for external drive implementations includes at least one or both of Universal Serial Bus (USB) and IEEE 1394 interface technologies.

The drives and their associated computer-readable media provide nonvolatile storage of data, data structures, computer-executable instructions, and so forth. For the computer 1302, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the invention.

A number of program modules can be stored in the drives and RAM 1312, including an operating system 1330, one or more application programs 1332, other program modules 1334 and program data 1336. All or portions of the operating system, applications, modules, and/or data can also be cached in the RAM 1312. It is appreciated that the invention can be implemented with various commercially available operating systems or combinations of operating systems.

A user can enter commands and information into the computer 1302 through one or more wired/wireless input devices, e.g., a keyboard 1338 and a pointing device, such as a mouse 1340. Other input devices (not shown) may include a microphone, an IR remote control, a joystick, a game pad, a stylus pen, touch screen, or the like. These and other input devices are often connected to the processing unit 1304 through an input device interface 1342 that is coupled to the system bus 1308, but can be connected by other interfaces, such as a parallel port, an IEEE 13134 serial port, a game port, a USB port, an IR interface, etc.

A monitor 1344 or other type of display device is also connected to the system bus 1308 via an interface, such as a video adapter 1346. In addition to the monitor 1344, a computer typically includes other peripheral output devices (not shown), such as speakers, printers, etc.

The computer 1302 may operate in a networked environment using logical connections via wired and/or wireless communications to one or more remote computers, such as a remote computer(s) 1348. The remote computer(s) 1348 can be a workstation, a server computer, a router, a personal computer, portable computer, microprocessor-based entertainment appliance, a peer device or other common network node, and typically includes many or all of the elements described relative to the computer 1302, although, for purposes of brevity, only a memory storage device 1350 is illustrated. The logical connections depicted include wired/wireless connectivity to a local area network (LAN) 1352 and/or larger networks, e.g., a wide area network (WAN) 1354. Such LAN and WAN networking environments are commonplace in offices, and companies, and facilitate enterprise-wide computer networks, such as intranets, all of which may connect to a global communication network, e.g., the Internet.

When used in a LAN networking environment, the computer 1302 is connected to the local network 1352 through a wired and/or wireless communication network interface or adapter 1356. The adaptor 1356 may facilitate wired or wireless communication to the LAN 1352, which may also include a wireless access point disposed thereon for communicating with the wireless adaptor 1356.

When used in a WAN networking environment, the computer 1302 can include a modem 1358, or is connected to a communications server on the WAN 1354, or has other means for establishing communications over the WAN 1354, such as by way of the Internet. The modem 1358, which can be internal or external and a wired or wireless device, is connected to the system bus 1308 via the serial port interface 1342. In a networked environment, program modules depicted relative to the computer 1302, or portions thereof, can be stored in the remote memory/storage device 1350. It will be appreciated that the network connections shown are exemplary and other means of establishing a communications link between the computers can be used.

The computer 1302 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

Figure 14:
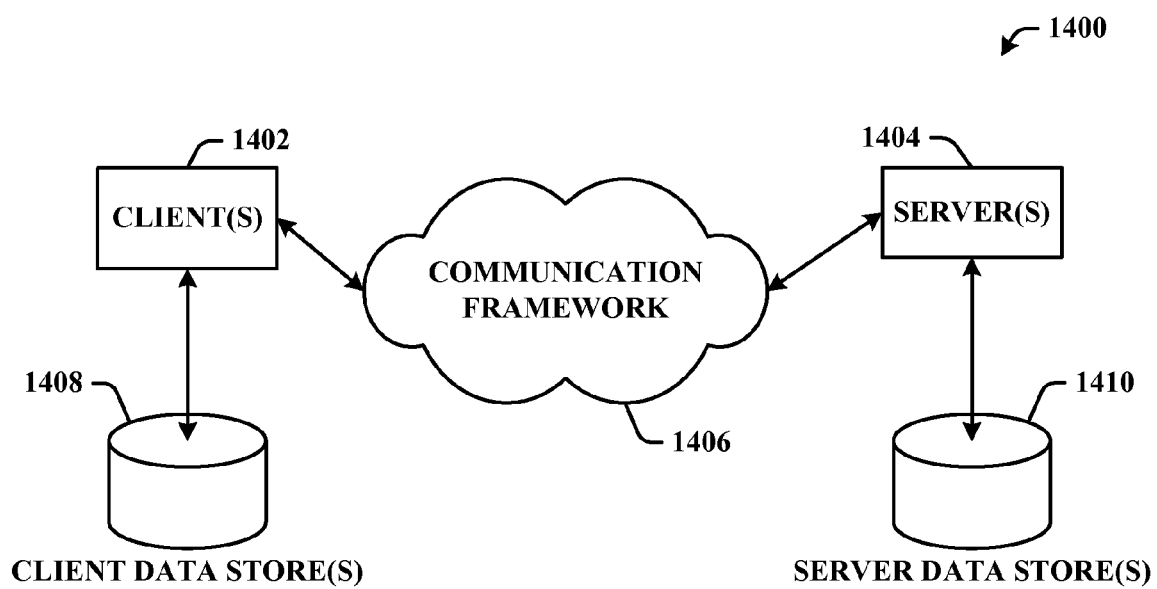
FIG. 14 is a schematic block diagram of a sample-computing environment with which the subject invention can interact.

Referring now to FIG. 14, there is illustrated a schematic block diagram of an exemplary computing environment 1400 in accordance with the subject invention. The system 1400 includes one or more client(s) 1402. The client(s) 1402 can be hardware and/or software (e.g., threads, processes, computing devices). The client(s) 1402 can house cookie(s) and/or associated contextual information by employing the invention, for example.

The system 1400 also includes one or more server(s) 1404. The server(s) 1404 can also be hardware and/or software (e.g., threads, processes, computing devices). The servers 1404 can house threads to perform transformations by employing the invention, for example. One possible communication between a client 1402 and a server 1404 can be in the form of a data packet adapted to be transmitted between two or more computer processes. The data packet may include a cookie and/or associated contextual information, for example. The system 1400 includes a communication framework 1406 (e.g., a global communication network such as the Internet) that can be employed to facilitate communications between the client(s) 1402 and the server(s) 1404.

Communications can be facilitated via a wired (including optical fiber) and/or wireless technology. The client(s) 1402 are operatively connected to one or more client data store(s) 1408 that can be employed to store information local to the client(s) 1402 (e.g., cookie(s) and/or associated contextual information). Similarly, the server(s) 1404 are operatively connected to one or more server data store(s) 1410 that can be employed to store information local to the servers 1404.

What has been described above includes examples of aspects of the claimed subject matter. It is, of course, not possible to describe every conceivable combination of components or methodologies for purposes of describing the claimed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has" or "having" or variations in form thereof are used in either the detailed description or the claims, such terms are intended to be inclusive in a manner similar to the term "comprising" as "comprising" is interpreted when employed as a transitional word in a claim.

What is claimed is:

1. A method, comprising:
    determining, by a system including a processor, respective minimum bit-rates for lossless decoding of respective bit-planes associated with at least one video frame using at least two reference frames, wherein the determining comprises, for a bit-plane of the respective bit-planes:
    determining a first minimum bit-rate for the lossless decoding of the bit-plane in a forward temporal order;
    determining a second minimum bit-rate for the lossless decoding of the bit-plane in a reverse temporal order;
    and selecting, as the minimum bit-rate for the bit-plane, a greater of the first minimum bit-rate or the second minimum bit-rate;
    and encoding the respective bit-planes at the respective minimum bit-rates using the at least two reference frames.

2. The method of claim 1, further comprising determining the first minimum bit-rate by iteratively, until the first minimum bit-rate is set:
    reconstructing the bit-plane using at least one of the at least two reference frames that precedes the at least one video frame in temporal order using a first bit-rate;
    determining whether the reconstructed bit-plane is equal to the bit-plane;
    in response to determining the reconstructed bit-plane is not equal to the bit-plane, increasing the first bit-rate; and
    in response to determining the reconstructed bit-plane is equal to the bit-plane, setting the first bit-rate as the first minimum bit-rate.

3. The method of claim 1, further comprising determining the second minimum bit-rate by iteratively, until the second minimum bit-rate is set:
    reconstructing the bit-plane using at least one of the at least two reference frames that follows the at least one video frame in temporal order using a second bit-rate;
    determining whether the reconstructed bit-plane is equal to the bit-plane;
    in response to determining the reconstructed bit-plane is not equal to the bit-plane, increasing the second bit-rate; and
    in response to determining the reconstructed bit-plane is equal to the bit-plane, setting the second bit-rate as the second minimum bit-rate.

4. The method of claim 1, wherein the at least one video frame includes a plurality of video frames, and further comprising reversing a playback operation of the plurality of video frames via decoding a subset of the plurality of video frames in reverse temporal order.

5. The method of claim 1, wherein the at least one video frame includes a plurality of video frames, and further comprising decreasing an error propagation via decoding a subset of the plurality of video frames in reverse temporal order.

6. The method of claim 1, wherein the at least one video frame includes a plurality of video frames, and further comprising switching from a first bit-stream to a second bit-stream that includes the plurality of video frames via decoding a subset of the plurality of video frames in reverse temporal order.

7. The method of claim 1, wherein the at least one video frame includes a plurality of video frames, and further comprising reconstructing spliced digital video that includes the plurality of video frames via decoding a subset of the plurality of video frames in reverse temporal order.

8. The method of claim 7, wherein the spliced digital video was spliced at an arbitrary point in time.

9. The method of claim 1, further comprising encoding respective motion vectors and block partition modes associated with the respective bit-planes at the respective minimum bit-rates.

10. The method of claim 1, further comprising determining respective rate adaptive codes for the respective minimum bit-rates.

11. The method of claim 10, wherein the encoding comprises encoding the respective bit-planes using the respective rate adaptive codes for the respective minimum bit-rates.

12. A system, comprising:
a bit-rate control component configured to identify respective minimum bit-rates for lossless decoding of respective bit-planes associated with at least one video frame using at least two reference frames, wherein to identify a minimum bit rate for a bit-plane of the respective bit-planes comprises, for a bit-plane of the respective bit-planes:
determining a first minimum bit-rate for the lossless decoding of the bit-plane in a forward temporal order;
determining a second minimum bit-rate for the lossless decoding of the bit-plane in a reverse temporal order;
select, as the minimum bit-rate for the bit-plane, a greater of the first minimum bit-rate or the second minimum bit-rate;
and an encoder configured to encode the respective bit-planes at the respective minimum bit-rates using the at least two reference frames.

13. The system of claim 12, wherein the bit-rate control component is further configured to identify the first minimum bit-rate by being further configured to iteratively, until the first minimum bit-rate is set:
reconstruct the bit-plane using at least one of the at least two reference frames that precedes the at least one video frame in temporal order using a first bit-rate;
determine whether the reconstructed bit-plane is equal to the bit-plane;
in response to the reconstructed bit-plane being determined not to be equal to the bit-plane, increase the first bit-rate; and
in response to the reconstructed bit-plane being determined to be equal to the bit-plane, set the first bit-rate as the first minimum bit-rate.

14. The system of claim 12, wherein the bit-rate control component is further configured to identify the second minimum bit-rate by being further configured to iteratively, until the second minimum bit-rate is set:
reconstruct the bit-plane using at least one of the at least two reference frames that follows the at least one video frame in temporal order using a second bit-rate;
determine whether the reconstructed bit-plane is equal to the bit-plane;
in response to the reconstructed bit-plane not being determined not to be equal to the bit-plane, increase the second bit-rate;
and in response to the reconstructed bit-plane being determined to be equal to the bit-plane, set the second bit-rate as the second minimum bit-rate.

15. A non-transitory computer-readable medium having instructions stored thereon that, in response to execution, cause a system including a processor to perform operations, comprising:
determining respective minimum bit-rates for lossless decoding of respective bit-planes associated with at least one video frame using at least two reference frames, wherein the determining comprises, for a bit-plane of the respective bit-planes:
determining a first minimum bit-rate for the lossless decoding of the bit-plane in a forward temporal order;
determining a second minimum bit-rate for the lossless decoding of the bit-plane in a reverse temporal order;
selecting, as the minimum bit-rate for the bit-plane, a greater of the first minimum bit-rate or the second minimum bit-rate;
and encoding the respective bit-planes at the respective minimum bit-rates using the at least two reference frames.

16. The non-transitory computer-readable medium of claim 15, further comprising determining the first minimum bit-rate by iteratively, until the first minimum bit-rate is set:
reconstructing the bit-plane using at least one of the at least two reference frames that is before the at least one video frame in temporal order using a first bit-rate;
determining whether the reconstructed bit-plane is equal to the bit-plane;
in response to determining that the reconstructed bit-plane is different than the bit-plane, increasing the first bit-rate; and
in response to determining that the reconstructed bit-plane is equal to the bit-plane, setting the first bit-rate as the first minimum bit-rate.

17. The non-transitory computer-readable medium of claim 15, further comprising determining the second minimum bit-rate by iteratively, until the second minimum bit-rate is set:
reconstructing the bit-plane using at least one of the at least two reference frames that is after the at least one video frame in temporal order using a second bit-rate;
determining whether the reconstructed bit-plane is equal to the bit-plane;
in response to the determining that the reconstructed bit-plane is different than the bit-plane, increasing the second bit-rate;
and in response to the determining that the reconstructed bit-plane is equal to the bit-plane, setting the second bit-rate as the second minimum bit-rate.

18. A system, comprising:
means for selecting respective minimum bit-rates for lossless decoding of respective bit-planes associated with at least one video frame using at least two reference frames, wherein the means for selecting, for a bit-plane of the respective bit-planes, determines a first minimum bit-rate for the lossless decoding of the bit-plane in a forward temporal order, determines a second minimum bit-rate for the lossless decoding of the bit-plane in a reverse temporal order, and selects a greater of the first minimum bit-rate or the second minimum bit-rate;
and means for encoding the respective bit-planes at the respective minimum bit-rates using the at least two reference frames.

19. The system of claim 18, further comprising means for selecting the first minimum bit-rate by iteratively, until the first minimum bit-rate is set:
reconstructing the bit-plane using at least one of the at least two reference frames that is before the at least one video frame in temporal order using a first bit-rate;
determining whether the reconstructed bit-plane is equal to the bit-plane;

in response to determining that the reconstructed bit-plane is different than the bit-plane, increasing the first bit-rate; and in response to determining that the reconstructed bit-plane is equal to the bit-plane, setting the first bit-rate as the first minimum bit-rate.

20. The system of claim 18, further comprising means for selecting the second minimum bit-rate by iteratively, until the second minimum bit-rate is set:

reconstructing the bit-plane using at least one of the at least two reference frames that is after the at least one video frame in temporal order using a second bit-rate;

determining whether the reconstructed bit-plane is equal to the bit-plane;

in response to the determining that the reconstructed bit-plane is different than the bit-plane, increasing the second bit-rate; and in response to the determining that the reconstructed bit-plane is equal to the bit-plane, setting the second bit-rate as the second minimum bit-rate.

21. The system of claim 18, further comprising means for encoding respective motion vectors and block partition modes associated with the respective bit-planes at the respective minimum bit-rates.

22. The system of claim 18, further comprising means for determining respective rate adaptive codes for the respective minimum bit-rates.

* * * * *